(12) United States Patent  
Burkland et al.

(10) Patent No.: US 12,278,255 B2
(45) Date of Patent: Apr. 15, 2025

(54) THIN FILM OBSCURANT FOR MICROELECTRONICS

(71) Applicant: Raytheon Company, Waltham, MA (US)

(72) Inventors: Michael K. Burkland, Tucson, AZ (US); Sean P. Kilcoyne, Lompoc, CA (US); Peter Bellus, Tucson, AZ (US)

(73) Assignee: Raytheon Company, Arlington, VA (US)

( * ) Notice: Subject to any disclaimer, the term of this patent is extended or adjusted under 35 U.S.C. 154(b) by 340 days.

(21) Appl. No.: 17/345,488

(22) Filed: Jun. 11, 2021

(65) Prior Publication Data

US 2022/0399394 A1     Dec. 15, 2022

(51) Int. Cl.
*H01L 27/146*     (2006.01)
*H04N 5/33*     (2023.01)

(52) U.S. Cl.
CPC .. *H01L 27/14649* (2013.01); *H01L 27/14629* (2013.01); *H01L 27/14685* (2013.01); *H04N 5/33* (2013.01)

(58) Field of Classification Search
None
See application file for complete search history.

(56) References Cited

U.S. PATENT DOCUMENTS

| 6,515,304 | B1 * | 2/2003 | Kash | H01L 27/02 |
| | | | | 257/E27.009 |
| 9,362,139 | B2 | 6/2016 | Ebefors et al. | |
| 9,825,073 | B2 * | 11/2017 | Webster | H04N 25/75 |
| 10,242,967 | B2 | 3/2019 | Drab et al. | |
| 10,508,030 | B2 | 12/2019 | Katkar et al. | |
| 10,509,752 | B2 | 12/2019 | Schreiber | |
| 11,114,488 | B1 * | 9/2021 | Lu | H01L 27/14609 |
| 2007/0069133 | A1 * | 3/2007 | DeWames | G01L 21/12 |
| | | | | 250/339.02 |
| 2007/0181905 | A1 | 8/2007 | Wang et al. | |
| 2011/0134954 | A1 * | 6/2011 | Letertre | H01S 5/183 |
| | | | | 257/E21.211 |
| 2016/0027832 | A1 * | 1/2016 | Lin | H01L 27/14629 |
| | | | | 257/432 |
| 2020/0083198 | A1 * | 3/2020 | Kuo | H01L 33/46 |
| 2020/0343218 | A1 | 10/2020 | Hu et al. | |

(Continued)

FOREIGN PATENT DOCUMENTS

| EP | 2648025 A1 * | 10/2013 | G02B 6/124 |
| JP | 2004309934 A | 11/2004 | |

(Continued)

OTHER PUBLICATIONS

Collins Tom; A Process For Manufacturing A Photonic Circuit; Oct. 9, 2013.*

(Continued)

*Primary Examiner* — Nilufa Rahim

(57) ABSTRACT

Methods and apparatus for an assembly having a first wafer including bulk material and a layer having microelectronics and a wafer with a deposited thin film which is bonded to the first wafer such that the reflected film is embedded within the composed assembly. The reflector wafer can include a handle wafer and a thin film having reflectance characteristics to prevent imaging of the microelectronics via light through the bulk material.

20 Claims, 8 Drawing Sheets

(56) References Cited

U.S. PATENT DOCUMENTS

| | | |
|---|---|---|
| 2021/0043587 A1 | 2/2021 | Lu et al. |
| 2022/0320015 A1* | 10/2022 | Jain .................. H01L 23/573 |

FOREIGN PATENT DOCUMENTS

| | | |
|---|---|---|
| JP | 2005266211 A | 9/2005 |
| JP | 2010055058 A | 3/2010 |
| JP | 2012018951 A | 1/2012 |
| KR | 10-2012-0055580 A | 5/2012 |
| KR | 10-2020-0005611 A | 1/2020 |
| TW | 201519980 A | 6/2015 |

OTHER PUBLICATIONS

Taiwan Office Action (with English Translation) dated Jan. 13, 2023 for Taiwan Application No. 111109241; 11 Pages.

PCT Invitation to Pay Additional Fees and Partial Search Report dated Jun. 23, 2022 for International Application No. PCT/US2022/018824; 13 Pages.

Response (with English Translation) to Taiwan Office Action dated Jan. 13, 2023 for Taiwan Application No. 111109241; Response filed Mar. 27, 2023; 22 Pages.

$2^{nd}$ Taiwan Office Action (with English Translation) dated Aug. 16, 2023 for Taiwan Application No. 111109241; 13 Pages.

PCT International Search Report and Written Opinion dated Aug. 17, 2022 for International Application No. PCT/US2022/018824; 18 Pages.

Response (with English Translation) to $2^{nd}$ Taiwan Office Action dated Aug. 16, 2023 for Taiwan Application No. 111109241; Response filed Nov. 1, 2023; 31 Pages.

Taiwan Allowance Decision (with English Translation) dated Nov. 29, 2023 for Taiwan Application No. 111109241; 3 Pages.

PCT International Preliminary Report on Patentability dated Dec. 21, 2023 for International Application No. PCT/US2022/018824; 11 Pages.

Office Action dated Jan. 14, 2025 in connection with Japanese Patent Application No. 2023-575369, 8 pages.

Office Action dated Jan. 21, 2025 in connection with Korean Patent Application No. 10-2023-7039404, 15 pages.

\* cited by examiner

| Layer | Material | Refractive Index | Extinction Coefficient | Optical Thickness (FWOT) | Physical Thickness (nm) |
|---|---|---|---|---|---|
| Medium | Air | 1.00000 | 0.00000 | | |
| 1 | HfO2 | 1.88867 | 0.00000 | 0.43963340 | 360.80 |
| 2 | SiO2 | 1.44402 | 0.00000 | 0.22209772 | 238.40 |
| 3 | SiPOLY | 3.48170 | 0.00090 | 0.06261624 | 27.88 |
| 4 | SiO2 | 1.44402 | 0.00000 | 0.53951582 | 579.11 |
| 5 | SiPOLY | 3.48170 | 0.00090 | 0.08964816 | 39.91 |
| 6 | SiO2 | 1.44402 | 0.00000 | 0.14325768 | 153.77 |
| 7 | SiPOLY | 3.48170 | 0.00090 | 0.18466218 | 82.21 |
| 8 | SiO2 | 1.44402 | 0.00000 | 0.05465066 | 58.66 |
| 9 | HfO2 | 1.88867 | 0.00000 | 0.24062874 | 197.48 |
| 10 | SiPOLY | 3.48170 | 0.00090 | 0.14486119 | 64.49 |
| 11 | SiO2 | 1.44402 | 0.00000 | 0.22937829 | 246.21 |
| Substrate | Si (CRYSTAL) | 3.62800 | 0.00000 | | |
| | | | | 2.35095009 | 2048.92 |

*FIG. 7*

| Layer | Material | Physical Thickness (nm) |
|---|---|---|
| | Air | |
| 1 | Si | 0.00 |
| 2 | SiO2 | 1000.00 |
| 3 | Al | 91.07 |
| 4 | SiO2 | 93.92 |
| 5 | Si | 0.00 |
| | Air | |
| | | 1184.99 |

*FIG. 8*

| Layer | Material | Refractive Index | Extinction Coefficient | Optical Thickness (FWOT) | Physical Thickness (nm) |
|---|---|---|---|---|---|
| Medium | Si (CRYSTAL) | 3.62800 | 0.00000 | | |
| 1 | SiO2 | 1.44402 | 0.00000 | 0.16769264 | 180.00 |
| 2 | SiO | 2.31319 | 0.00000 | 0.09401999 | 63.00 |
| 3 | SiO2 | 1.44402 | 0.00000 | 0.10154721 | 109.00 |
| 4 | SiO | 2.31319 | 0.00000 | 0.10148189 | 68.00 |
| 5 | SiO2 | 1.44402 | 0.00000 | 0.19843629 | 213.00 |
| 6 | SiPOLY | 3.48170 | 0.00090 | 0.17071562 | 76.00 |
| 7 | SiO2 | 1.44402 | 0.00000 | 0.04005991 | 43.00 |
| 8 | SiPOLY | 3.48170 | 0.00090 | 0.22462581 | 100.00 |
| 9 | SiO2 | 1.44402 | 0.00000 | 0.11458997 | 123.00 |
| 10 | SiPOLY | 3.48170 | 0.00090 | 0.46048292 | 205.00 |
| 11 | SiO2 | 1.44402 | 0.00000 | 0.10806859 | 116.00 |
| 12 | SiPOLY | 3.48170 | 0.00090 | 0.23361084 | 104.00 |
| 13 | SiO2 | 1.44402 | 0.00000 | 0.23290645 | 250.00 |
| 14 | SiO | 2.31319 | 0.00000 | 0.21042568 | 141.00 |
| 15 | SiO2 | 1.44402 | 0.00000 | 0.17421402 | 187.00 |
| 16 | SiPOLY | 3.48170 | 0.00090 | 0.19991697 | 89.00 |
| 17 | SiO2 | 1.44402 | 0.00000 | 0.21893206 | 235.00 |
| 18 | SiO | 2.31319 | 0.00000 | 0.01044667 | 7.00 |
| 19 | SiPOLY | 3.48170 | 0.00090 | 0.30324485 | 135.00 |
| 20 | SiO2 | 1.44402 | 0.00000 | 0.46301802 | 497.00 |
| Substrate | Si (CRYSTAL) | 3.62800 | 0.00000 | | |
| | | | | 3.82843640 | 2941.00 |

*FIG. 9*

| Layer | Material | Refractive Index | Extinction Coefficient | Optical Thickness (FWOT) | Physical Thickness (nm) |
|---|---|---|---|---|---|
| Medium | Si (CRYSTAL) | 3.62800 | 0.00000 | | |
| 1 | TiO2 | 2.25000 | 0.00000 | 0.68463609 | 471.64 |
| 2 | SiO2 | 1.44402 | 0.00000 | 0.23685902 | 254.24 |
| 3 | SiPOLY | 3.48170 | 0.00090 | 0.06103506 | 27.17 |
| 4 | SiO2 | 1.44402 | 0.00000 | 0.54182082 | 581.59 |
| 5 | SiPOLY | 3.48170 | 0.00090 | 0.10842224 | 48.27 |
| 6 | SiO2 | 1.44402 | 0.00000 | 0.17029586 | 182.79 |
| 7 | SiPOLY | 3.48170 | 0.00090 | 0.16233650 | 72.27 |
| 8 | SiO2 | 1.44402 | 0.00000 | 0.06150606 | 66.02 |
| 9 | TiO2 | 2.25000 | 0.00000 | 0.21725597 | 149.67 |
| 10 | SiPOLY | 3.48170 | 0.00090 | 0.13866592 | 61.73 |
| 11 | SiO2 | 1.44402 | 0.00000 | 0.21885790 | 234.92 |
| Substrate | Si (CRYSTAL) | 3.62800 | 0.00000 | | |
| | | | | 2.60169144 | 2150.31 |

# THIN FILM OBSCURANT FOR MICROELECTRONICS

BACKGROUND

As is known in the art, electronic circuitry can be formed in a substrate, such as a silicon substrate. Silicon is transparent in the Short Wave Infra-Red (SWIR) spectrum starting from approximately 900 nm. Short wave infrared energy may be used for imaging microelectronic circuitry through the backside of a silicon substrate upon which the electronics is fabricated. SWIR imaging may be for inspection, failure analysis of fabricated microelectronic circuits, and the like. However, SWIR imaging can also be used for unauthorized imaging of integrated circuits that may enable reverse engineering of electronic devices.

SUMMARY

Example embodiments of the disclosure may provide methods and apparatus for a microelectronic circuit assembly having a film, such as a multilayer material, on a substrate, such as crystalline silicon, for reflecting incident radiation. In embodiments, the film includes layers having contrasting optical properties by constructive/destructive interference from the surface of alternating material layers of contrasting indices of refraction. Such multilayer reflectors are known as Bragg Reflectors It should be noted that the goal is to reduce transmission of light, and light that is reflected is necessarily not transmitted. In some embodiments, other thin films capable of attenuating transmission may also be used, such as light-absorbing films, total internal reflection coatings or other reflector films. Thin films can be applied with a variety of techniques known in the art, such as Physical Vapor Deposition (PVD) or Chemical Vapor Deposition (CVD), and include such techniques as sputtering, cathodic arc and Atomic Layer deposition (ALD).

In embodiments, a thin film reflector of SWIR is configured to block light between about 900 nm and about 1600 nm, which may correspond with the wavelengths of commonly available lasers. The film can be deposited on a blank silicon substrate wafer, for example. Direct bonding of the wafer (see, e.g., S. H. Christiansen, R. Singh and U. Gosele, "Wafer Direct Bonding: From Advanced Substrate Engineering to Future Applications in Micro/Nanoelectronics," in Proceedings of the IEEE, vol. 94, no. 12, pp. 2060-2106, December 2006, doi: 10.1109/JPROC.2006.886026.) to a like silicon wafer to produce an engineered wafer with an embedded reflecting layer. The engineered wafer can reflect and scatter SWIR illumination. In embodiments, microelectronics are fabricated at the wafer level. Thinning of these wafers and bonding to a wafer with the thin film defeats inspection via SWIR from the backside of the assembly. The film obscures any passive visual inspection of a microelectronics device from the backside.

In one aspect, an assembly comprises: a first wafer including bulk material and a layer having microelectronics; and a reflector wafer bonded to the first wafer, wherein the reflector wafer comprises a handle wafer and a thin film having reflectance characteristics to prevent imaging of the microelectronics via light through the bulk material.

An assembly can further include one or more of the following features: the first wafer comprises a readout integrated circuit, the first wafer comprises an oxide layer, the assembly includes, in order, the handle wafer, the thin film, the bulk material and the layer of microelectronics, an oxide layer between the thin film and the bulk material, the light comprises light in the infrared spectrum, the bulk material comprises silicon, the thin film comprises layers of first and second materials, the thin film comprises layers of polysilicon and silicon oxide, the thin film comprises a layer of aluminum, the thin film comprises titanium oxide, the thin film comprises a Bragg reflector, the first wafer comprises sapphire and/or SiC, and/or the thin film is deposited.

In another aspect, a method comprises: forming microelectronics in a layer of a first wafer that includes a bulk material; and bonding a reflector wafer to the first wafer, wherein the reflector wafer comprises a handle wafer and a thin film having reflectance characteristics to prevent imaging of the microelectronics via light through the bulk material.

A method can further include one or more of the following features: the first wafer comprises a readout integrated circuit, the first wafer comprises an oxide layer, the assembly includes, in order, the handle wafer, the thin film, the bulk material and the layer of microelectronics, an oxide layer between the thin film and the bulk material, the light comprises light in the infrared spectrum, the bulk material comprises silicon, the thin film comprises layers of first and second materials, the thin film comprises layers of polysilicon and silicon oxide, the thin film comprises a layer of aluminum, the thin film comprises titanium oxide, the thin film comprises a Bragg reflector, the first wafer comprises sapphire and/or SiC, and/or the thin film is deposited.

BRIEF DESCRIPTION OF THE DRAWINGS

The foregoing features of this disclosure, as well as the disclosure itself, may be more fully understood from the following description of the drawings in which:

FIGS. 7, 8, 9, and 10 are tabular representations of example thin film stackups for an opaque layer; and FIG. 11 is a schematic representation of an opaque layer reflecting IR light to prevent backside imaging of circuitry.

DETAILED DESCRIPTION

Figure 1:
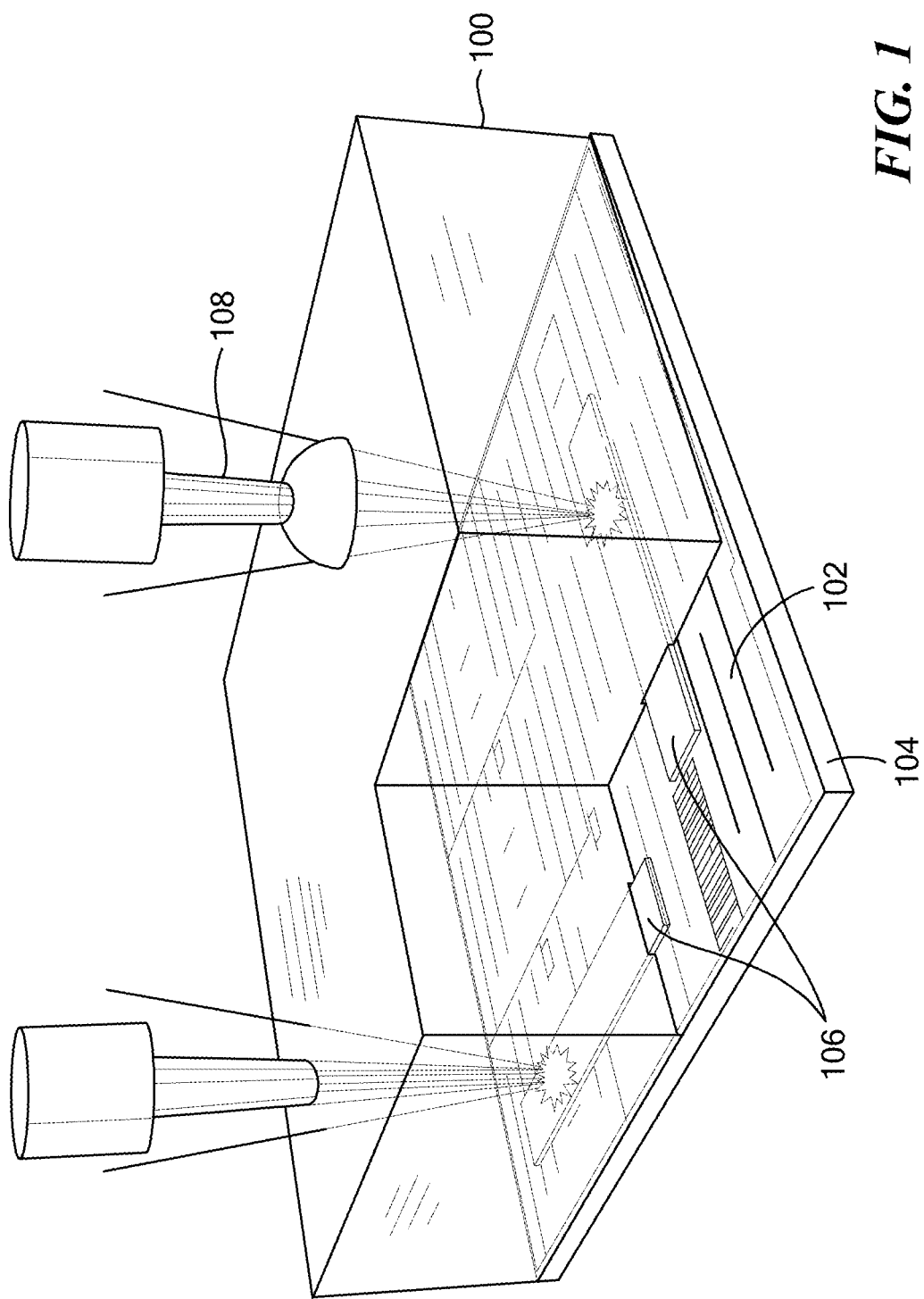
FIG. 1 is a schematic representation of backside imaging of circuitry on a substrate blocked by an opaque layer in accordance with example embodiments of the disclosure.

FIG. 1 shows an example assembly 100 having microelectronics 102 formed in a substrate 104 with an opaque layer 106 that blocks energy 108 from reaching the microelectronics 102 for preventing imaging of the circuitry. In embodiments, the substrate 104 comprises silicon through which SWIR passes. The opaque layer 106 prevents imaging the circuitry 102 via non-destructive observation from backside of the assembly 100.

Figure 2:
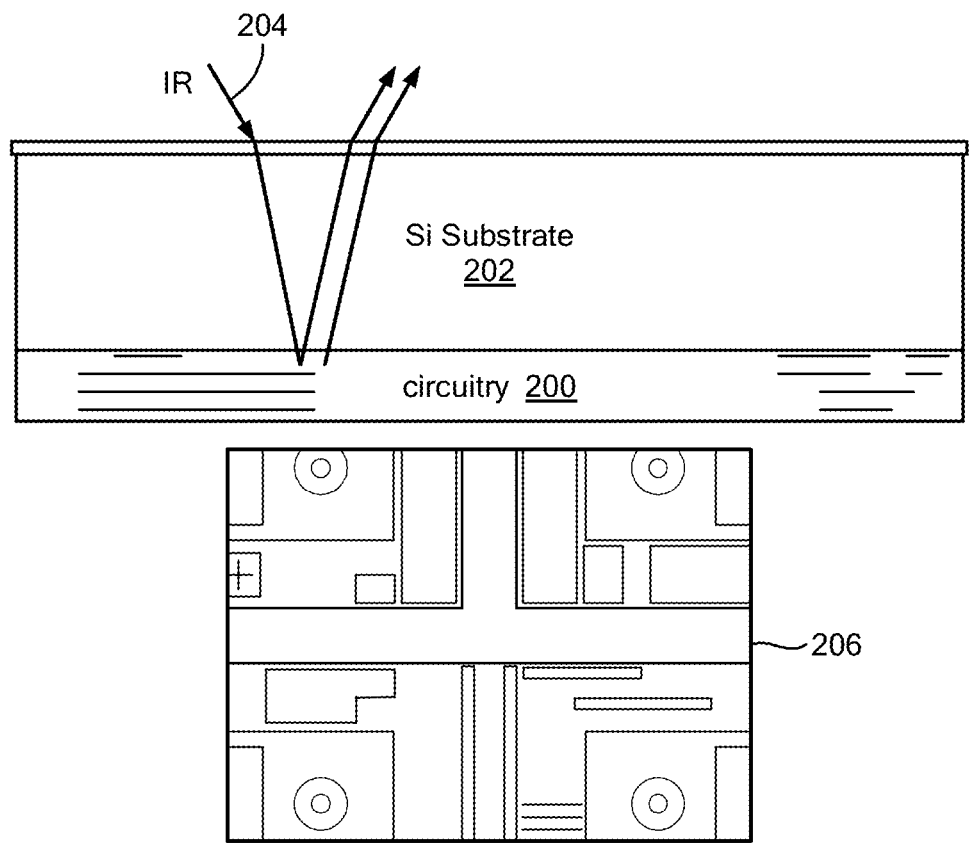
FIG. 2 shows unauthorized prior art backside imaging of circuitry through a substrate.

FIG. 2 shows unauthorized inspection of microelectronic circuitry 200 on a substrate 202 via direct imaging in accordance with the prior art. Backside Infrared (IR) energy 204 through the substrate 302 can be used to generate an image 206 of the circuitry 200.

Figure 3:
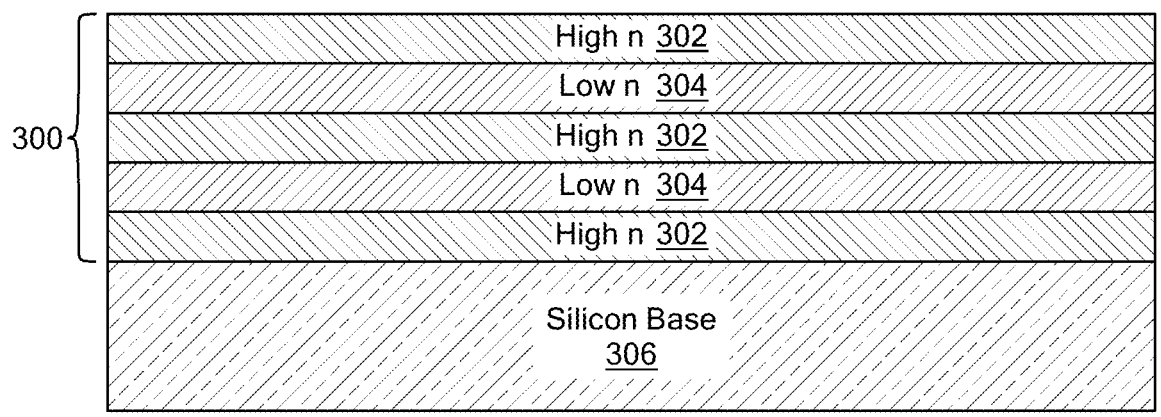
FIG. 3 is a cross-sectional view of an example film stack up for a layer to prevent imaging.

FIG. 3 shows an example opaque layer 300 that blocks energy from a selected bandwidth, such as IR. In the illustrated embodiment, a series of high reflectance layers are provided by a first material 302 and a series of low reflectance layers are provided by a second material 304 that combine to block energy from reaching a substrate 306, which may comprise silicon. The layers of first and second materials 302, 304 alternate to provide the desired reflectance characteristics.

The first and second materials 302, 304 can comprise any suitable material that combine to provide reflection characteristics to meet the needs of a particular application. For example, reflection characteristics can include blocking energy within particular bandwidths, which may correspond to certain types of lasers.

In addition, the thickness of the first and second materials 302, 304 can be selected to achieve desired constructive and destructive interference characteristics. The thickness of the first and second materials can be the same or different. Further, any practical number of different materials can be used in varying order to achieve desired reflectance performance.

Films can be formed on a substrate using any suitable technique, such as sputtering. In addition, the substrate can comprise any suitable material, such as silicon, sapphire, carbide, etc.

Figure 4:
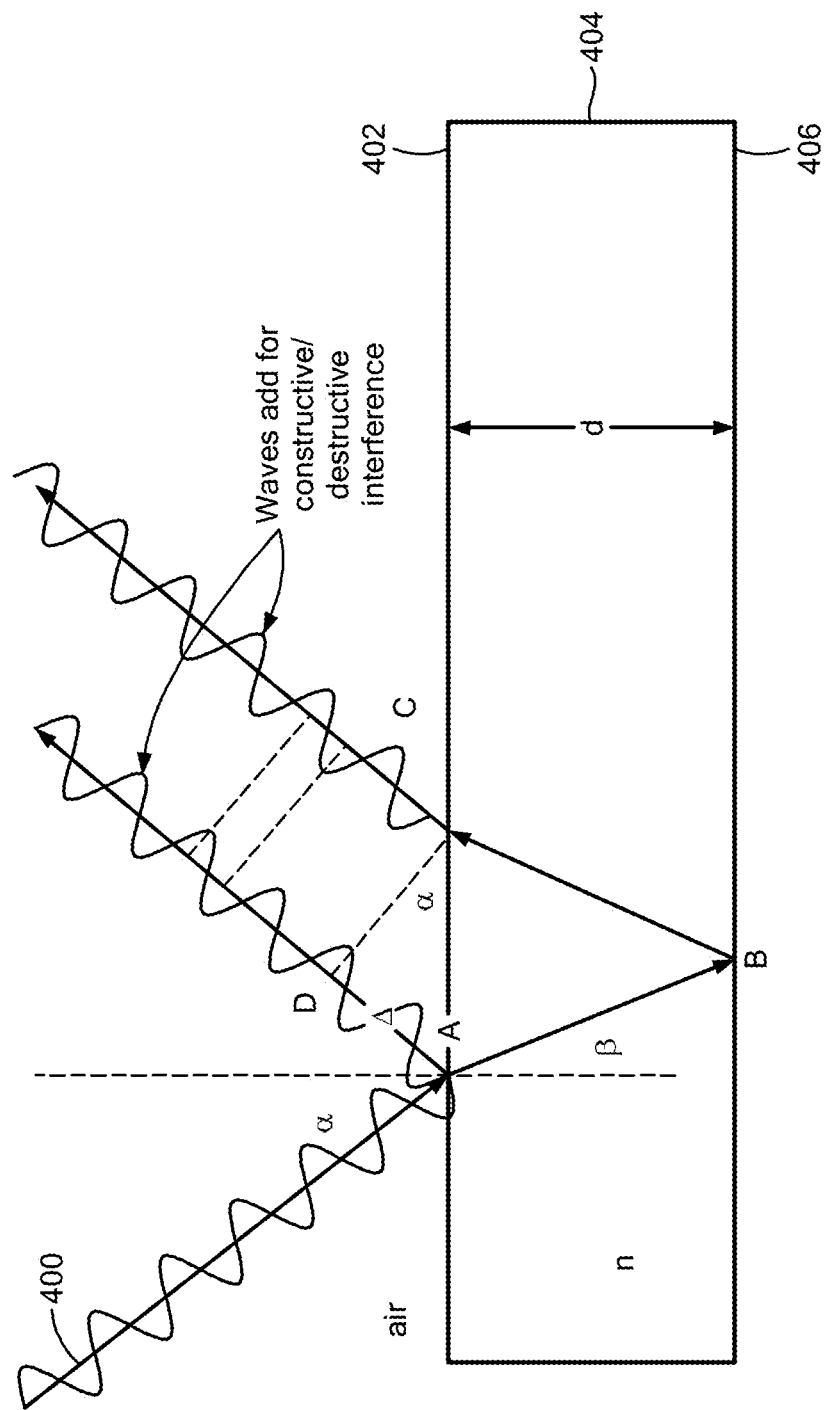
FIG. 4 is a cross-sectional view demonstrating constructive and destructive interference for a thin film.

FIG. 4 shows directed light 400, such as a laser beam, at an incidence angle α on the surface 402 of a film/layer 404 having a thickness d and an index of refraction n. Some of the light is reflected from the surface 402 and some of the light enters the film at a refraction angle β. The bottom surface 406 of the film/layer may reflect light to the surface 402. As is well understood by those skill in the art, the waves of the reflected light can combine constructively or destructively. The optical path difference for the film layers results in a phase difference defined as:

$$\Delta = n(AB+BC) - AD = 2nd \cos \beta$$

where points A, B, C, D define distances AB, BC, and AD.

For a phase change=π, a destructive phase change can be defined as $2dn \cos \beta = m\lambda$, where m is an integer and λ is wavelength and a constructive phase change can be defined as $2dn \cos \beta = (m-\frac{1}{2})\lambda$. For a phase change of 0, a constructive phase change is $2dn \cos \beta = m\lambda$ and a destructive phase change is $2dn \cos \beta = (m-\frac{1}{2})\lambda$. It is understood that reflected light experiences a phase change of 180 degrees when it reflects from a medium of higher index of refraction and no phase change when it reflects from a medium of smaller index of refraction.

Commercially available software, such as that sold by ESSENTIAL MACLEOD SOFTWARE company can be used to design thin films having various reflectance characteristics based on the index of refraction of the various material layers.

Figure 5:
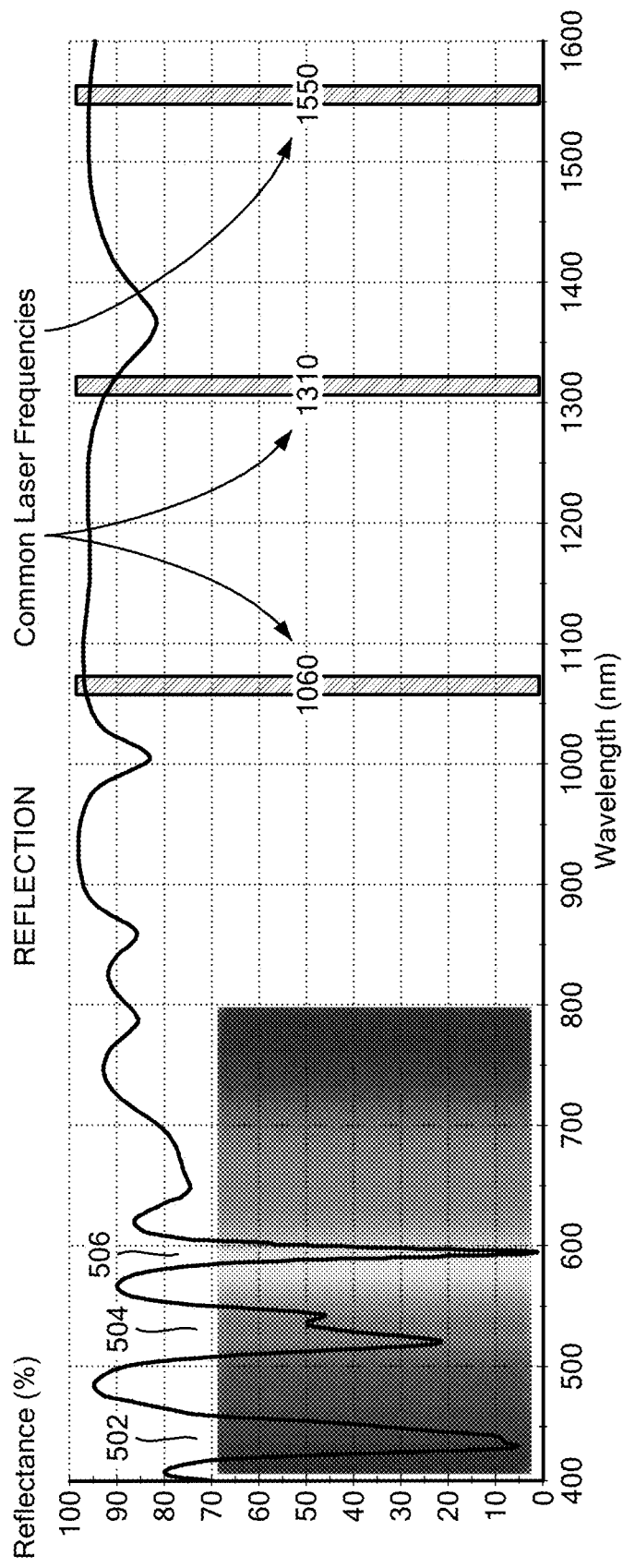
FIG. 5 is a graphical representation of reflectance versus wavelength for an example opaque layer.

FIG. 5 shows reflectance characteristics 500 for an example opaque film for blocking certain light frequencies. As can be seen, the film is transmissive, i.e., low reflectance for certain bandwidths 502, 504, 506, in the visible light spectrum. At common laser frequencies, shown as 1060 nm, 1310 nm, and 1550 nm, the film approaches 100% reflectance. Since the laser light, or any wavelength is the SWIR band, is reflected, circuitry cannot be imaged by lasers in the reflected bandwidths.

Figure 6:
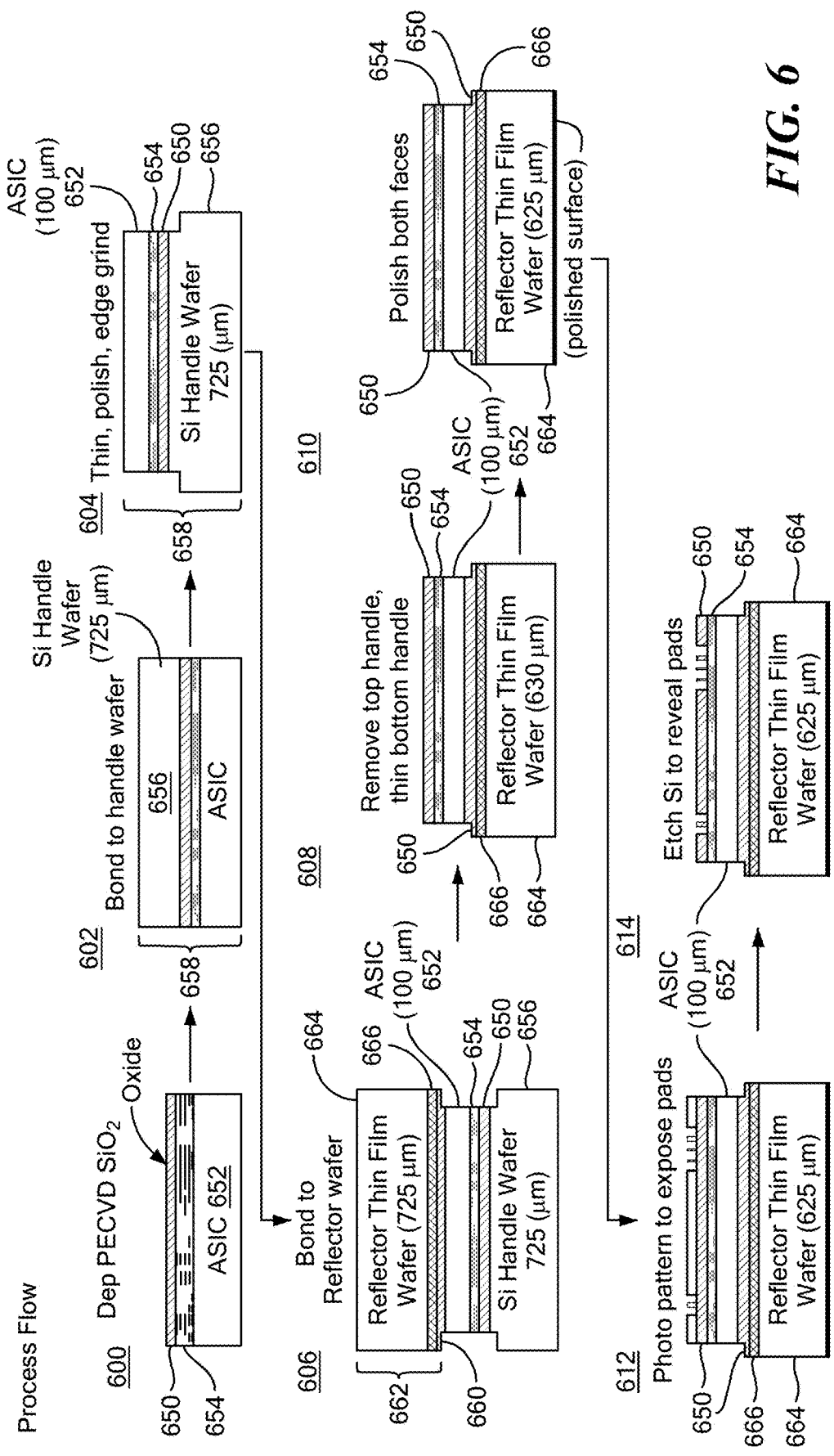
FIG. 6 is a flow diagram showing an example sequence of steps for providing an assembly with an opaque layer to prevent backside imaging of circuitry.

FIG. 6 shows an example sequence of steps for fabricating a wafer with a light blocking layer. In step 600, an oxide layer 650 is formed or deposited onto a wafer 652 that has an integrated circuit 654, such as a read out integrated circuit (ROIC), formed in an active layer of the wafer. In step 602, a handle wafer 656 is bonded to the ROIC wafer 652 to form an assembly 658. In step 604, the assembly 658 is flipped and the ROIC wafer 652 is thinned, polished, and edge grinded. In one particular embodiment, the ROIC wafer 652 is thinned to a thickness in the order of 100 micrometers.

In step 606, an oxide layer 660 is formed on a reflector wafer 662 having a silicon wafer 664, for example, and a thin film reflector layer 666, is bonded. The reflector wafer 662 is bonded to the ROIC assembly 658. In step 608, after flipping the assembly, the reflector wafer 662 is thinned to a desired thickness and the handle wafer 656 is removed. In step 610 the top and bottom faces of the assembly can be polished. In step 612, a photo pattern 670 can be placed on the assembly and in step 614 the silicon can be etched to reveal connection pads. The assembly is then ready for ball grid array processing, for example.

It is understood that the location/depth of the reflector and the circuitry can be selected to meet the needs of a particular application. While example dimensions may be used herein including in the figures, it is understood that any practical dimensions can be used.

FIG. 7 shows an example thin film stack that can provide desired reflectance characteristics. As can be seen, alternating layers of $HfO_2$, $SiO_2$, and SiPoly having respective indexes of refraction and selected thickness can used to provide a blocking film to prevent imaging of a circuit layer.

Figures 10, 11:
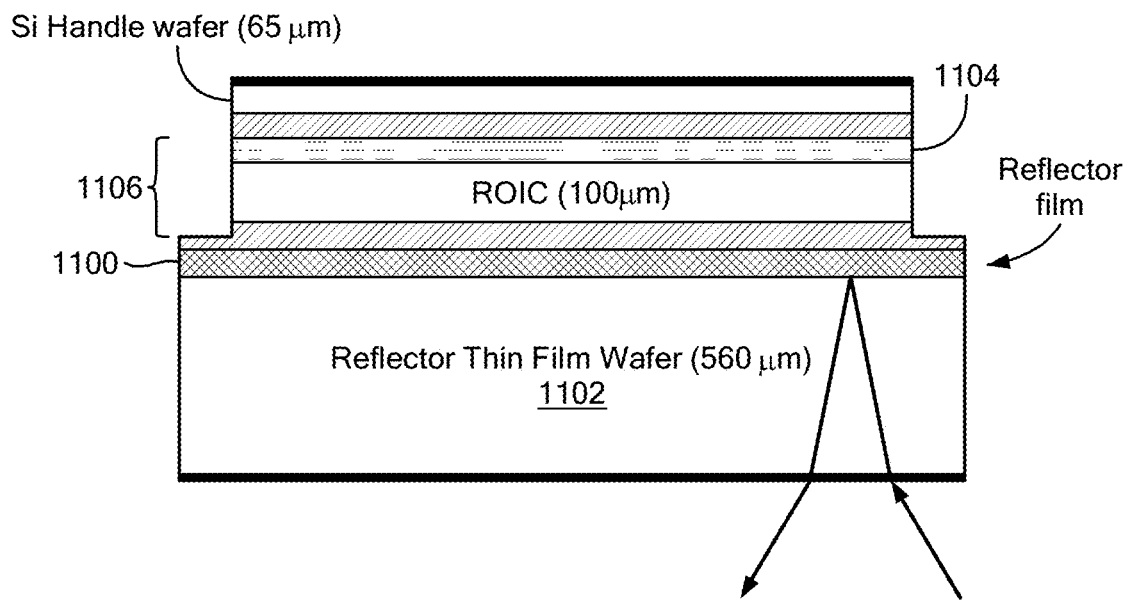

FIG. 8 shows an example film stackup comprising layers of aluminum and silicon oxide. FIG. 9 shows an example film stackup comprising layers of SiO, SiPoly, and SiO. FIG. 10 shows an example Titanium Oxide based stackup.

As can be seen in FIG. 11, a reflector film 1100 of a reflector wafer 1102 can reflect light to block backside imaging of circuitry 1104 on an integrated circuit 1106, such as a ROIC.

In some embodiments, a scattering layer can also be used. As used herein, a thin film has reflectance of at least 50% to prevent imaging of the microelectronics via light through the bulk material. A 50% reduction in reflectivity, due to increased transmission and scattering from a SWIR obscurant, at a 50% reduction in contrast (MTF=0.5), reduces the resolution by over 3× compared to no obscurant.

It is understood that a reflectance of the thin film can be above 50%. For example, in some embodiments thin film reflectance can be above 90%.

Having described exemplary embodiments of the disclosure, it will now become apparent to one of ordinary skill in the art that other embodiments incorporating their concepts may also be used. The embodiments contained herein should not be limited to disclosed embodiments but rather should be limited only by the spirit and scope of the appended claims. All publications and references cited herein are expressly incorporated herein by reference in their entirety.

Elements of different embodiments described herein may be combined to form other embodiments not specifically set forth above. Various elements, which are described in the context of a single embodiment, may also be provided separately or in any suitable subcombination. Other embodiments not specifically described herein are also within the scope of the following claims.

What is claimed is:

1. An assembly, comprising:
   a first wafer including bulk material and a layer having microelectronics;
   an oxide layer; and a reflector wafer bonded to the first wafer, wherein the reflector wafer comprises a thin film having reflectance characteristics to prevent imaging of the microelectronics via light through the bulk material, wherein the assembly includes, in order, the thin film, the oxide layer, the bulk material, and the layer of microelectronics, wherein the thin film comprises a first layer of hafnium dioxide on a side of the thin film contacting air, and wherein the thin film further comprises at least one layer of polysilicon and at least one layer of silicon dioxide.

2. The assembly according to claim 1, wherein the first wafer comprises a readout integrated circuit.

3. The assembly according to claim 1, wherein the first wafer further comprises a second oxide layer.

4. The assembly according to claim 1, wherein the light comprises light in the infrared spectrum.

5. The assembly according to claim 1, wherein the bulk material comprises silicon.

6. The assembly according to claim 5, wherein the silicon comprises crystalline silicon.

7. The assembly according to claim 1, wherein the thin film further comprises titanium oxide.

8. The assembly according to claim 1, wherein the thin film comprises a Bragg reflector.

9. The assembly according to claim 1, wherein the first wafer comprises at least one of sapphire or silicon carbide.

10. The assembly according to claim 1, wherein the thin film is deposited.

11. The assembly according to claim 1, wherein the thin film further comprises layers of silicon oxide disposed among the at least one layer of polysilicon and the at least one layer of silicon dioxide.

12. The assembly according to claim 1, further comprising a second layer of hafnium dioxide disposed between one of the at least one layer of polysilicon and one of the at least one layer of silicon dioxide.

13. A method, comprising:
forming microelectronics in a layer of a first wafer that includes a bulk material;
forming an oxide layer on the first wafer; and
bonding a reflector wafer to the first wafer, wherein the reflector wafer comprises a thin film having reflectance characteristics to prevent imaging of the microelectronics via light through the bulk material,
wherein an assembly includes, in order, the thin film, the oxide layer, the bulk material, and the layer of microelectronics,
wherein the thin film comprises a first layer of hafnium dioxide on a side of the thin film contacting air, and
wherein the thin film further comprises at least one layer of polysilicon and at least one layer of silicon dioxide.

14. The method according to claim 13, wherein the first wafer comprises a readout integrated circuit.

15. The method according to claim 13, wherein the first wafer further comprises a second oxide layer.

16. The method according to claim 13, wherein the light comprises light in the infrared spectrum.

17. The method according to claim 13, wherein the bulk material comprises silicon.

18. The method according to claim 17, wherein the silicon comprises crystalline silicon.

19. The method according to claim 13, wherein the thin film comprises a Bragg reflector.

20. The method of claim 13, further comprising:
forming the thin film using Physical Vapor Deposition (PVD), Chemical Vapor Deposition (CVD), sputtering, or Atomic Layer deposition (ALD).

* * * * *